(12) United States Patent
Narula et al.

(10) Patent No.: US 10,892,771 B1
(45) Date of Patent: Jan. 12, 2021

(54) SEGMENTED RESISTOR DIGITAL-TO-ANALOG CONVERTER

(71) Applicant: TEXAS INSTRUMENTS INCORPORATED, Dallas, TX (US)

(72) Inventors: Rohit Narula, Bengaluru (IN); Preetam Charan Anand Tadeparthy, Bengaluru (IN); Mayank Jain, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/582,243

(22) Filed: Sep. 25, 2019

(51) Int. Cl.
*H03M 1/78* (2006.01)
*H03M 1/46* (2006.01)

(52) U.S. Cl.
CPC ........... *H03M 1/785* (2013.01); *H03M 1/462* (2013.01)

(58) Field of Classification Search
CPC .............................. H03M 1/785; H03M 1/462
USPC .................................................. 341/144, 155
See application file for complete search history.

(56) References Cited

U.S. PATENT DOCUMENTS

| | | | | |
|---|---|---|---|---|
| 7,595,684 B2* | 9/2009 | Maejima | ................ | G11C 5/145 327/536 |
| 8,013,770 B2* | 9/2011 | Yang | ................... | H03M 1/0648 341/144 |
| 9,112,528 B1* | 8/2015 | Currivan | ................ | H03M 1/002 |
| 9,425,814 B1* | 8/2016 | Verma | ................... | H03M 7/165 |
| 10,340,935 B1* | 7/2019 | Tanabe | ................ | H03M 1/1071 |

* cited by examiner

*Primary Examiner* — Brian K Young
(74) *Attorney, Agent, or Firm* — Lawrence J. Bassuk; Charles A. Brill; Frank D. Cimino

(57) ABSTRACT

An analog-to-digital converter (ADC) includes a digital-to-analog converter (DAC) having a resistor network. The resistor network includes a first and second segments. The first segment includes a first switch coupled between a first supply voltage node and a first set of resistors. The second segment includes a second switch coupled between the first supply voltage node and a second set of resistors. The first segment includes a third switch coupled in series with a second resistor. The series-combination of the third switch and second resistor coupled in parallel with at least one resistor of the first set of resistors. The second segment includes a fourth switch coupled in series with a third resistor. The series-combination of the fourth switch and third resistor is coupled in parallel with at least one resistor of the second set of resistors.

19 Claims, 9 Drawing Sheets

US 10,892,771 B1

SEGMENTED RESISTOR DIGITAL-TO-ANALOG CONVERTER

BACKGROUND

One type of analog-to-digital converter (ADC) is a successive approximation register (SAR) ADC. A SAR ADC determines the output digital code in an iterative fashion beginning with most significant bit (MSB), then the next most significant bit, and so on, until the least significant bit (LSB) is determined. Each cycle of the SAR ADC compares the input analog signal to a threshold voltage that is reset with each successive iteration. In the first cycle, the threshold voltage is set to the midpoint of the input voltage range and the MSB is determined to be a "1" if the input voltage is above the threshold voltage or a "0" if the input voltage is below the threshold voltage. Once the MSB is known, the threshold voltage is reset in the cycle to be the midpoint in the range between the previous midpoint voltage and the maximum input voltage if the MSB was determined to be a 1, or to the midpoint in the range between 0V (i.e., the lower end of the input voltage range) and the previous midpoint voltage if the MSB was determined to be a 0. The process repeats, with the threshold voltage being reset each cycle until the LSB is determined. At that point, the complete digital output code has been determined.

A SAR ADC includes a digital-to-analog converter (DAC) to convert a digital value to the threshold voltage to be compared, by a comparator, to the analog input signal. The digital value provided to the DAC changes each cycle, and thus the analog output threshold voltage from the DAC also changes each cycle, as described above.

SUMMARY

In one example, an analog-to-digital converter (ADC) includes a digital-to-analog converter (DAC) having a resistor network. The resistor network includes a first and second segments. The first segment includes a first switch coupled between a first supply voltage node and a first set of resistors. The second segment includes a second switch coupled between the first supply voltage node and a second set of resistors. The first segment includes a third switch coupled in series with a second resistor. The series-combination of the third switch and second resistor coupled in parallel with at least one resistor of the first set of resistors. The second segment includes a fourth switch coupled in series with a third resistor. The series-combination of the fourth switch and third resistor is coupled in parallel with at least one resistor of the second set of resistors.

BRIEF DESCRIPTION OF THE DRAWINGS

For a detailed description of various examples, reference will now be made to the accompanying drawings in which.

DETAILED DESCRIPTION

Figure 1:
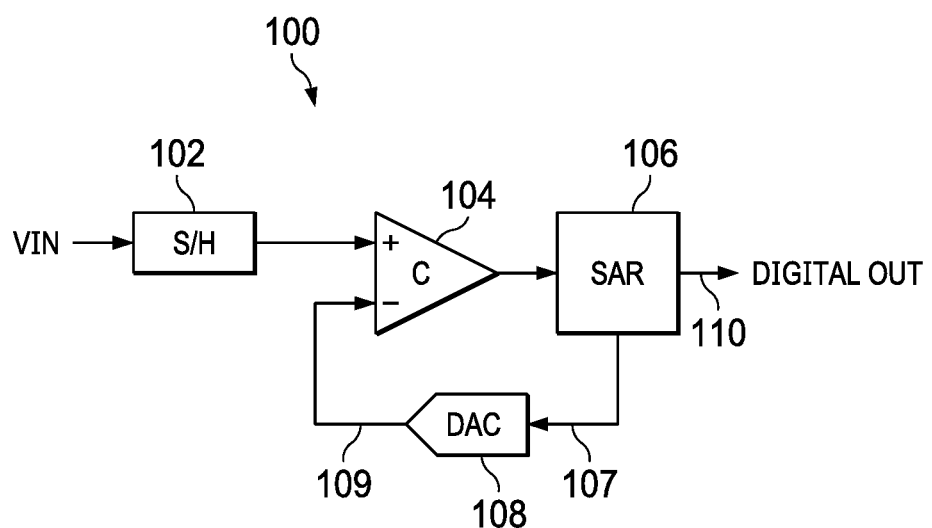
FIG. 1 illustrates an example of a successive approximation register (SAR)-based analog-to-digital converter (ADC).

FIG. 1 shows an example implementation of a SAR ADC 100. The example SAR ADC 100 includes a sample-and-hold circuit 102, a comparator 104, a SAR 106, and a DAC 108. The sample-and-hold circuit 102 samples and holds the input voltage, VIN, which is then compared to a threshold voltage 109 from the DAC 108 by the comparator 104. The output from the comparator 104 is a high level or a low level depending on whether VIN is greater than or less then DAC's output voltage. The output from the comparator 104 in each cycle represents the next most significant bit of the output digital code. The output digital code is stored in the SAR 106 and can be retrieved therefrom as digital output code 110. The SAR 106 also provides a digital value 107 to the DAC 108. The DAC 108 converts the digital value 107 to the analog threshold voltage 109 to be provided to the comparator 104. The digital value 107 is updated with each cycle of the conversion process until all of the bits of the digital output code 110 are determined.

Figure 2:
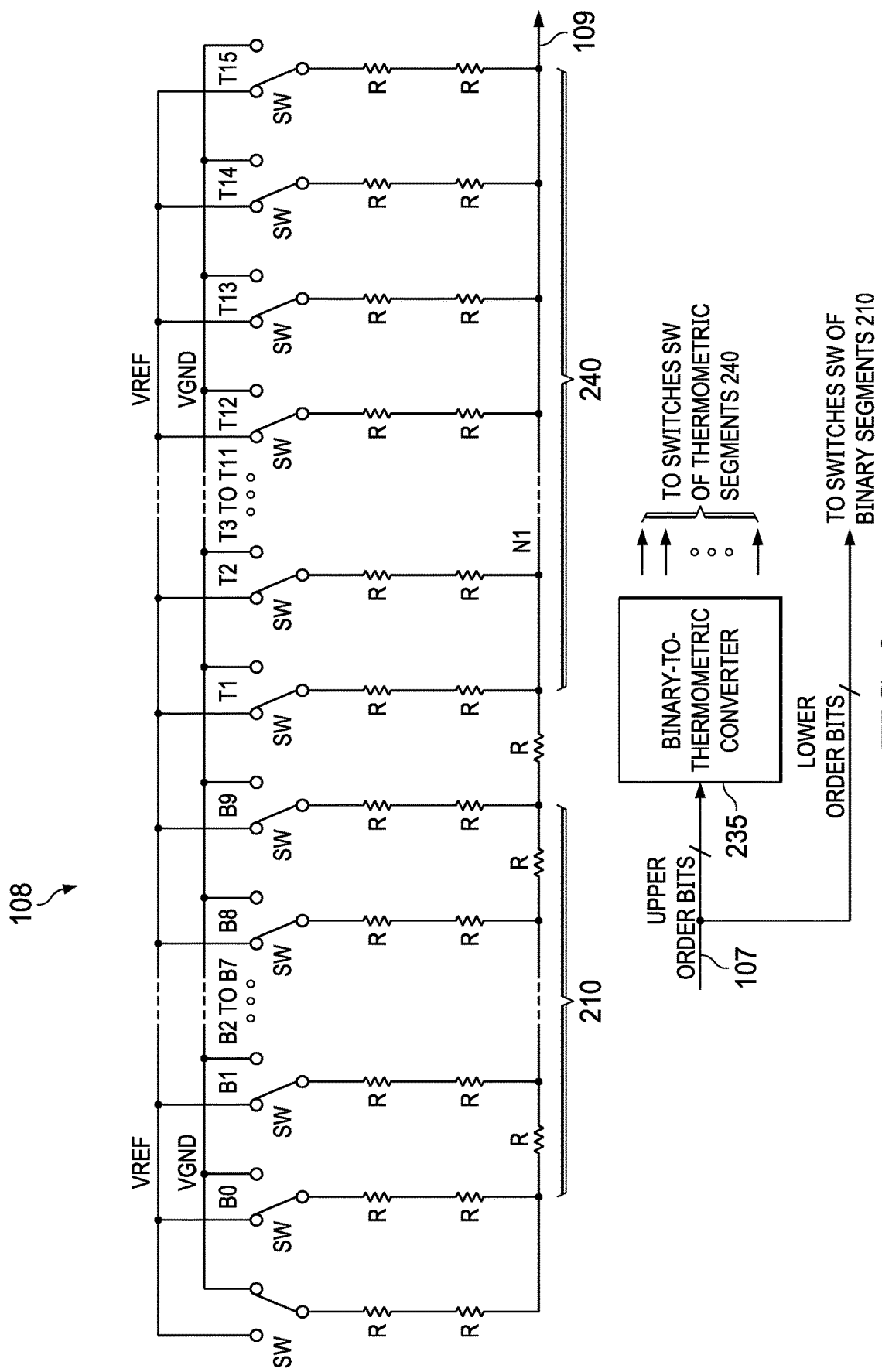
FIG. 2 shows an example implementation of a resistor-based digital-to-analog converter (DAC) used in the SAR ADC of FIG. 1.

FIG. 2 shows an example implementation of DAC 108. In this example, DAC 108 comprises a resistor network and a binary-to-thermometric converter 235. The resistor network includes multiple binary segments 210 and multiple thermometric segments 240. In this example, each binary segment 210 includes a switch SW and two series-connected resistors R. Another resistor R connects one binary segment 210 to the binary segment 210 as shown. Each resistor R is referred to as a "unit" resistor. The architecture of the binary segments 210 may be referred to as an R-2R resistor network. Each thermometric segment 240 also includes a switch SW and two series-connected resistors R, but without an additional resistor connected between thermometric segments 240.

Each switch SW couples the respective series-connected resistors of that segment to either a reference voltage (VREF) or ground (VGND). In this example, DAC 108 includes 10 binary segments 210 and 15 thermometric segments 240. The DAC 108 in the example of FIG. 2 is a 14-bit DAC in which the 10 least significant bits [B9:B0] of the digital value 107 from SAR 106 control the switches SW of the binary segments 210, as shown at 236. A binary bit being, for example, a "1" causes the corresponding switch to couple VREF to the resistors of that segment, while a binary bit being a "0" causes the corresponding switch to couple VGND to the resistors of that segment. The upper four bits of the digital value 107 are converted, by the binary-tothermometric converter 235, to a 15-bit thermometric code to control the switches SW of the 15 thermometric segments, T1 through T15. In each cycle, one (or none) of the thermometric bits is high (which couples that segment's resistors to VREF) and the rest are low (which couples the resistors of those segments to VGND) based on the value of the upper four bits of the digital value 107. The node N1 connecting the thermometric segments 240 together provides the threshold voltage 109 from the DAC 108 to the comparator 104.

Figure 3:
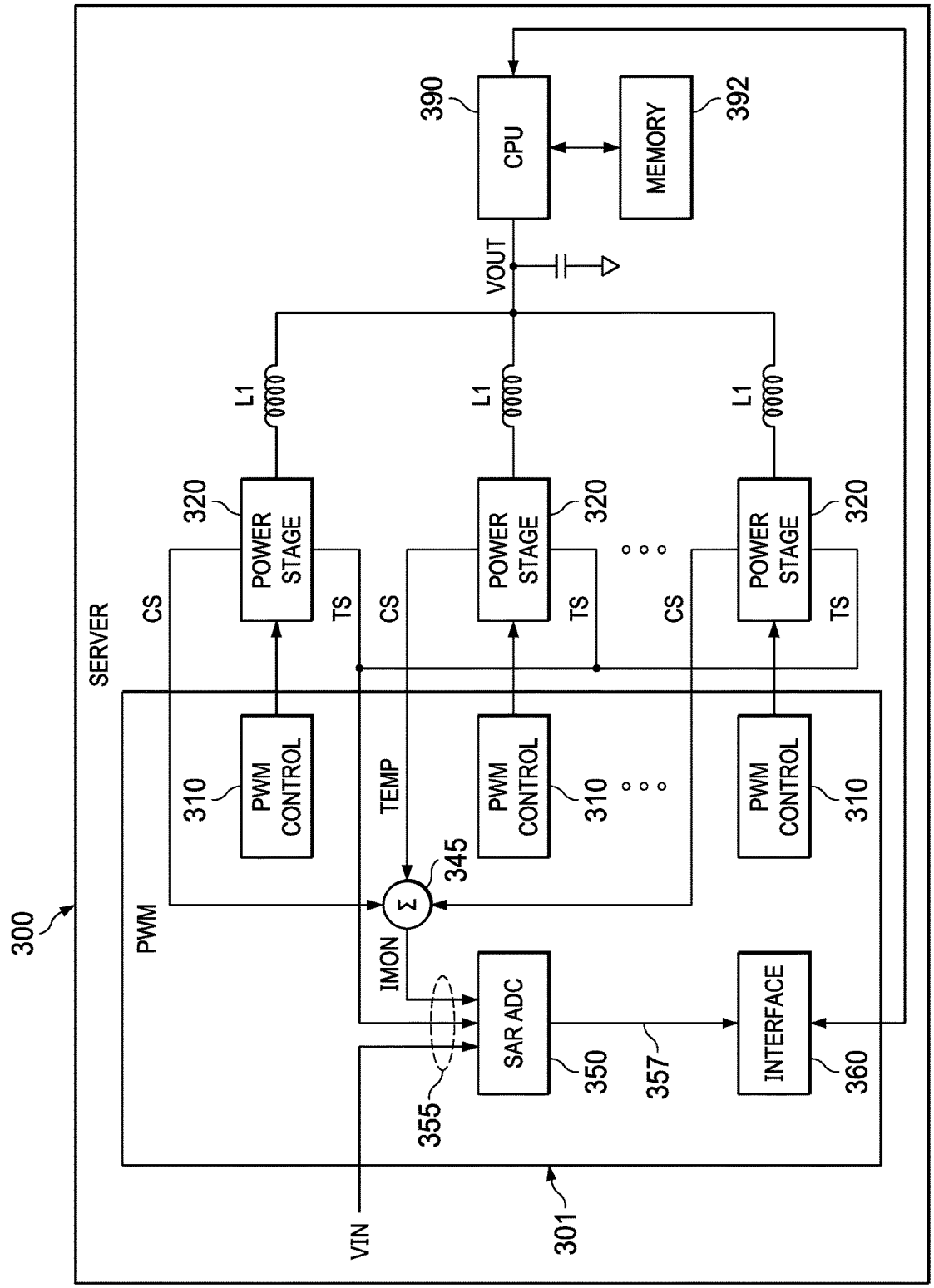
FIG. 3 shows an example of a server computer including an integrated circuit (IC) in which the SAR ADC of FIG. 1 is used.

FIG. 3 shows an example of a server 300 (or other type of computer) that includes a pulse width modulator (PWM) integrated circuit (IC) 301, multiple power stages 320, multiple inductors L1, a central processing unit (CPU) 390, and memory 392. Other components can be included as well. The PWM IC 301 comprises a multi-phase PWM. Multiple PWM control circuits 310 are provided within PWM IC 301, and each PWM control circuit 310 is coupled to a corresponding power stage 320. Each power stage 320 may comprise, for example, a pair of transistors connected between a power supply node and ground. Each power stage 320 couples to a corresponding inductor L1. The inductors L1 are connected together as shown to produce a supply voltage (VOUT) to the CPU 390. The supply voltage also may be used to power other devices within the server 300 such as the memory 392. Each PWM control circuit 310 controls when each transistor within the corresponding power stage 320 is on and off to thereby regulate the voltage to the CPU 390.

Each power stage 320 produces a current sense (CS) signal and a temperature sense (TS) signal. The CS signal represents the current of the respective power stage 320. The CS signals are summed together by a summer 345 to generate a combined current (IMON). The TS signals are indicative of the temperature of the respective power stage 320. The TS signals are connected together as a single input to the PWM IC 301 to provide a signal indicative of the hottest power stage 320.

The PWM IC 301 in the example of FIG. 3 also includes a SAR ADC 350, which is usable to convert any of multiple analog signals 355 to a digital value 357. Examples of such analog signals 355 include the input voltage (VIN) to the PWM IC 300, the IMON signal, the TEMP signal, etc. A communication interface 360 (e.g., compliant with the Power Management Bus ("PMBus") protocol) is coupled to the SAR ADC 350 and can transmit the digital values 355 to an external device.

The differential nonlinearity (DNL) of a DAC is a metric describing the deviation between two analog voltages corresponding to adjacent input digital values and measures the error in the digital-to-analog conversion process. In some applications (e.g., PWM IC 301), one SAR ADC 350 is used to digitize multiple different analog signals. As such, different DNL requirements may be imposed on the SAR ADC 355 for different voltage ranges. For one of the analog signals 355, for example, the DNL requirement for the SAR ADC's DAC may be one-half LSB DNL for a 14-bit converter and for a voltage range of 1.5V to 1.75V and a reference voltage (VREF) within the DAC of 1.92V. Other analog signals 355 may have less stringent DNL requirements.

In addition to the SAR ADC having a certain DNL requirement for a particular voltage range, the settling time of the SAR ADC's DAC limits the conversion speed of the SAR ADC. The settling time is the time following a change in the state of the switches SW that must elapse before the voltage on node N1 is guaranteed to have reached its final voltage level. Larger settling times means slower digital-to-analog conversion. Another issue to be considered is the on-resistance of the switches SW, which can be large enough to cause a relatively large integral nonlinearity (INL). The DAC described below addresses one or more of these three issues, that is, (1) the DNL requirement for a particular voltage range, (2) settling time, and (3) effect of switch on-resistance on INL. As a result, the analog-to-digital conversion process within the server 300 will have less error (for at least one or more of the analog signals 355), have a faster settling time, and/or have a lower INL without an increase in switch size (as will be explained below). In one example, the CPU 390 reads the digitized values of IMON, TEMP, VIN, etc. and, depending on the magnitude of one or more of those parameters, modify its operating environment. For example, the CPU 390 may cause its operating frequency or operating voltage to be lowered if the current or temperature exceed respective thresholds. The CPU 390 can submit a signal or message to the PWM IC 301 through the interface 360 to cause a change in VOUT. Consequently, the more accurate (due to improved DNL performance) is the digitized value of, for example, IMON, the more effective will be the control the CPU's operating environment. In this example, the DAC within the SAR ADC 350 is configured to have a predetermined DNL for the signal range of the IMON signal so that the server 300 can more effectively monitor and control its operating environment.

The DNL of resistor network-based DAC is worse at the transition from one digital value to the next when all of the switches SW with the binary segments 210 change state. For example, for a 14-bit DAC, for digital value of 1023 (decimal), the lowest order 10 bits are all "1", and thus all 10 switches SW of the binary segments 210 are controlled to connect the resistors R in those segments to VREF. The next adjacent digital value is 1024, which means that all of the lowest order 10 bits are "0," and thus all 10 switches SW of the binary segments 210 are controlled to connect the resistors R to VGND. The change in state of all 10 switches SW within the binary segments 210 also occurs at transitions from 2047 to 2048, 3071 to 3072, and so on—each time the lowest order 10 bits change from all "1's" to all "0's."

The DNL of a DAC will be lower if the resistances of the resistors R are all exactly the same. However, in practice a resistor-based DAC does not include identical resistances of all of its resistors. The resistance of a resistor within DAC 108 can be modeled as $R(1+\sigma)$, where $\sigma$ is the mismatch coefficient of the resistor. The resistor mismatch is generally random across the resistors of the DAC for a given resistor size. That is, the manufacturer of the IC containing the DAC will guarantee a particular value of the mismatch coefficient ($\sigma$) for all resistors of a certain size. For that reason, the resistors within the example DAC 108 are all of the same dimensions and thus the same area (the area refers to the cross-sectional area of a resistor along the current path through the resistor). The mismatch coefficient $\sigma$ of the unit resistors R is Gaussian in nature. The mismatch coefficient $\sigma$ is inversely proportional to the square root of the area of the resistor. Two unit resistors R connected in series, for example, have an effective resistance of $2R(1+\sigma/\sqrt{2})$. As such, increasing the area of a resistor results in a decrease in the effective mismatch coefficient (i.e., $\sigma/\sqrt{2}$), and a decrease in the mismatch coefficient of resistors within a DAC results in a desirably lower DNL.

As noted above, it may be desirable to have a lower DNL for a particular voltage range of the DAC. In the example above, a DNL of one-half LSB DNL for a 14-bit converter and for a voltage range of 1.5V to 1.75V and a reference voltage (VREF) of 1.92V may be desirable. In the range of 1.5V to 1.75V for a 14-bit DAC (10 binary bits and 15 thermometric bits) with a 1.92V reference, the major digital value transitions (in which all of the 10 binary segments 210 switches SW change state) occurs at DAC analog output voltages of 1.56V and 1.68V. These voltages result when controlling the T13 switch SW to connect its resistors to VREF (which produces 1.56V), and also when controlling the T14 switch SW to connect its resistors to VREF (which produces 1.68V).

Figure 4:
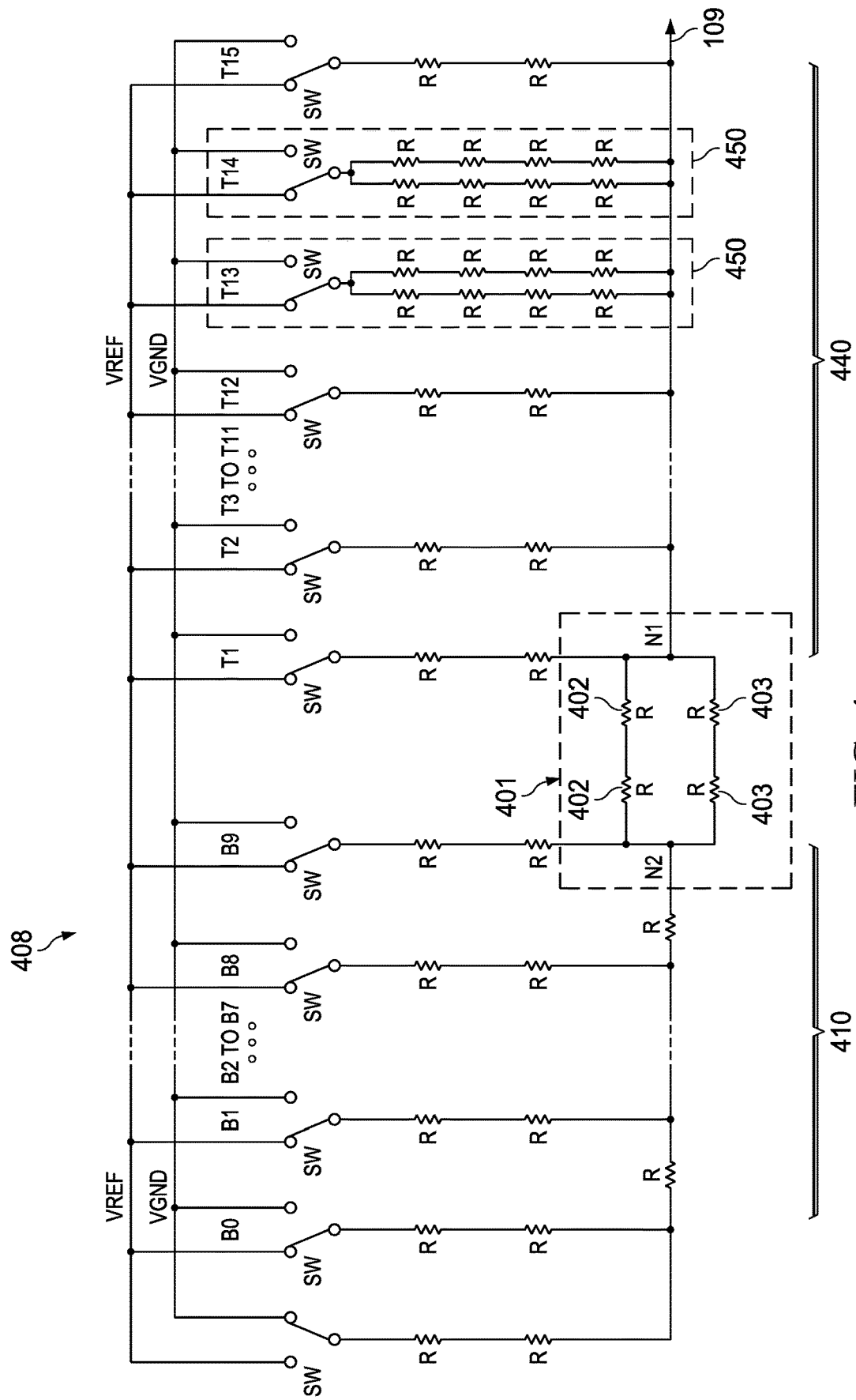
FIG. 4 shows another example implementation of a resistor-based DAC used in the SAR ADC of FIG. 1.

FIG. 4 shows an example implementation of a DAC 408 which has an architecture similar to that of DAC 108 in FIG. 2, but with the single unit resistor R connecting the binary segments 210 to the thermometric segments 240 in FIG. 2 implemented as four instances of unit resistor R in FIG. 4 (shown at 401), and each of the two unit resistors R in the thermometric segments for T13 and T14 in FIG. 2 replaced in the example of FIG. 4 with two parallel sets of four series-connected unit resistors R (shown at 450). The four unit resistors R at 401 comprise two resistors 402 connected in series and two resistors 403 connected in series. Series-connected resistors 402 are connected in parallel with series-connected resistors 403. The resulting effective resistance between nodes N1 and N3 is still the resistance of a single unit resistor R, but the area of the group of resistors 402 and 403 is four-times the area of a single unit resistor. Similarly, reference numeral 450 illustrates four series-connected unit resistors R which has a combined resistance of 4R. When each four unit resistors in series is connected in parallel with another set of four series-connected unit resistors R, the resulting effective resistance of that segment is 2R.

As such, the effective resistance between nodes N1 and N2 is still R and within the T13 and T14 thermometric segments the effective resistance is still 2R. However, the overall area of the four unit resistors at 401 is four times the area (A) of the unit resistor R (i.e., 4A), and thus the effective resistance of the two parallel sets of series-connected unit resistors at 401 is $R(1+\sigma/2)$, and thus the resistance mismatch compared to a single unit resistor is smaller. Further, the overall area of the eight unit resistors in the T13 and T14 thermometric segments at 450 is four-times larger than the area of two unit resistors in series as in FIG. 2. Advantageously the effective resistance of the two parallel sets of series-connected unit resistors at 450 is $2R(1+\sigma'/2)$, whereas for two series-connected unit resistors as in FIG. 2, the effective resistance of each such segment is $2R(1+\sigma')$, where $\sigma'$ is the effective mismatch coefficient of two unit resistors in series. The resistor mismatch is thus smaller for the effective resistance at 401 and at 450 in FIG. 4 compared to the corresponding resistances in FIG. 2.

DAC 408 thus has a lower DNL at certain digital values corresponding to the analog output voltages of interest and may have a higher DNL at other digital values. That the DNL may be higher for other digital values will not detrimentally impact the performance of the SAR ADC in which DAC 408 is used given the particular analog signals being digitized and their use.

Figure 5:
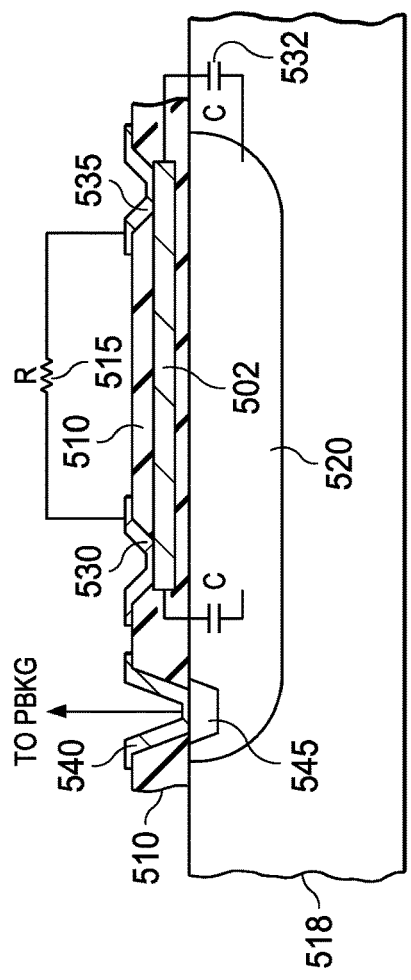
FIG. 5 shows an example implementation of a unit resistor used in the DAC of a SAR ADC.

FIG. 5 shows an example implementation of a single unit resistor R. In this example, the unit resistor is the resistance of polysilicon 502 within a silicon dioxide (or other type of dielectric) layer 502. The dielectric layer 502 is formed on a doped (e.g., n-doped) well 520, and doped well 520 is formed within a substrate 518 (e.g., p-doped substrate). Electrical contacts 530 and 535 (e.g., vias) are provided to opposing ends of the polysilicon 502. The resistance 515 represents the resistance of the polysilicon 502. An electrical contact 540 also is provided to an n-doped region 545 within the n-well 520. N-doped region 545 has a higher doping concentration than n-well 520. In the example shown, well 520 and region 545 are n-doped, but they can be p-doped in other examples. In one example, region 545 is p-doped and the substrate 518 is n-doped thereby forming a p-n junction. To avoid forward biasing the p-n junction formed between p-doped region 545 and the n-doped substrate 518, the same voltage applied to the substrate is also applied to the electrical contact 545. That voltage is shown as PBKG in FIG. 5. The n-well 520 also may be connected to the PBKG voltage.

Capacitors C in FIG. 5 represent a parasitic bulk capacitance formed between polysilicon 502 and n-well 520. The parasitic capacitance is distributed along the length of polysilicon 502 and the underlying n-well 520 but can be modeled mathematically as two capacitors C of equal capacitance as shown on opposite ends of the polysilicon 502.

Figure 6:
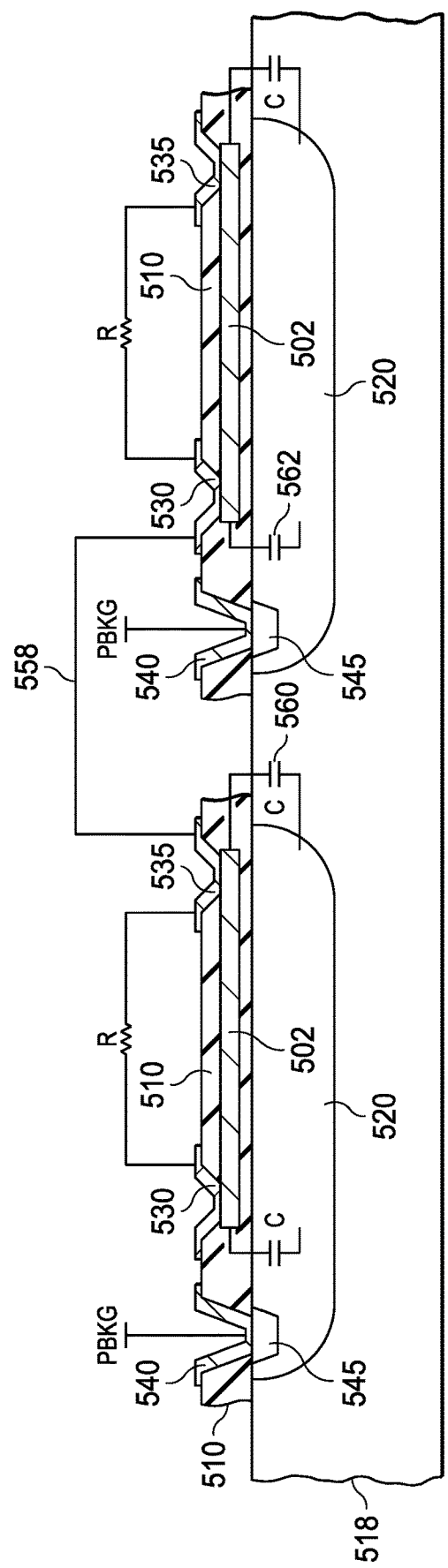
FIG. 6 illustrates two unit resistors, as in FIG. 5 connected in series.

FIG. 6 illustrates two series-connected polysilicon-based unit resistors. The electrical contact 530 of one resistor is connected to the electrical contact 535 of the other resistor as shown. The effective resistance between electrical contact 535 on the right-hand polysilicon-based resistor and electrical contact 530 of the left-hand polysilicon-based resistor is 2R. Capacitors 560 and 562 represent parasitic capacitances C that are electrically connect in parallel by way of conductor 558 and that both n-wells 520 are biased at the same voltage PBKG.

Figure 7:
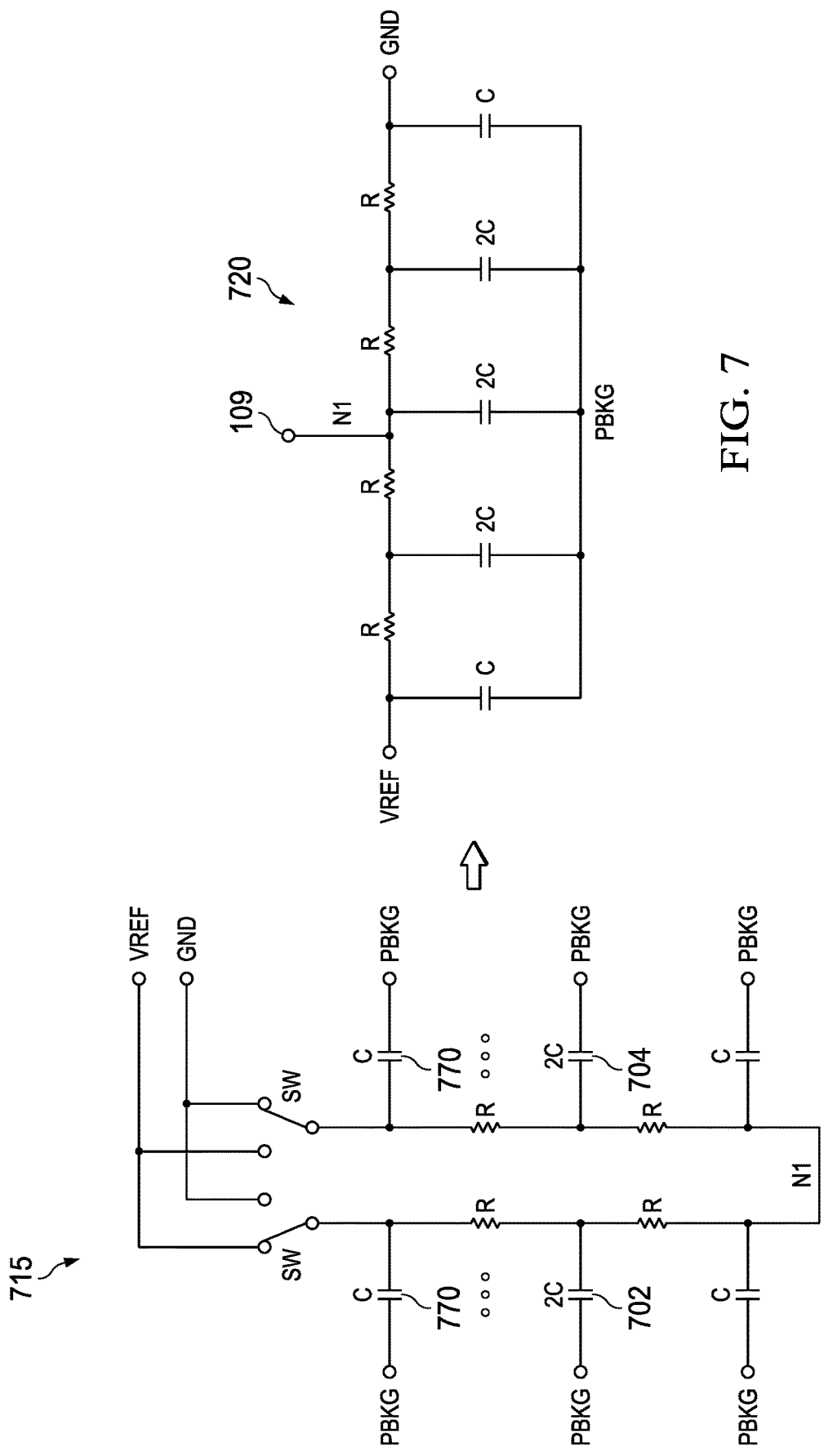
FIG. 7 includes an electrical circuit model of two adjacent segments of a resistor-based DAC as in FIG. 6.

FIG. 7 shows the electrical circuit model 715 of two of the binary or thermometric segments 210, 240 of DAC 108 including the parasitic capacitances of capacitors C1. Each segment includes two unit resistors R in series as described above. A capacitor C is connected between each end of a resistor R and the PBKG voltage. Reference numerals 702 and 704 indicate a 2C capacitor which represents the parallel combination of capacitors 560 and 562 between adjacent resistors as described above regarding FIG. 6.

The electrical circuit model 715 is redrawn at in FIG. 7 as representation 720 to more readily illustrate the distributed RC network of the DAC. Due to the parasitic capacitance of the polysilicon-based unit resistors R, the settling time of the DAC is a function of the product of R and C.

Figure 8:
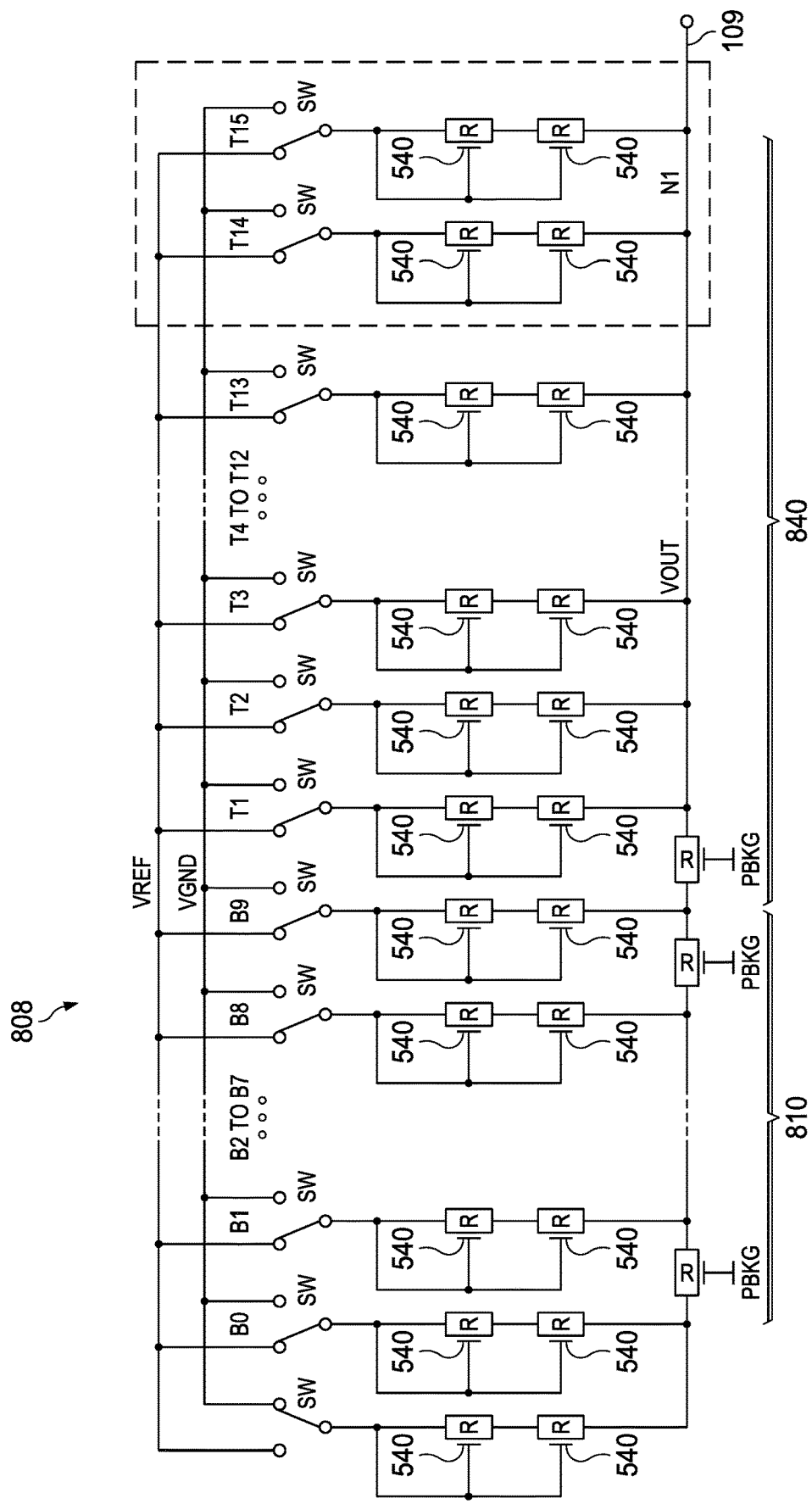
FIG. 8 shows yet another example implementation of a resistor-based DAC used in the SAR ADC of FIG. 1.

FIG. 8 illustrates a DAC 808 with an architecture similar to that of FIG. 2 but with each unit resistor R having its electrical contact 540 (which is connected to n-well 520 and thus to one terminal of capacitor C) connected to the corresponding switch SW rather than to the PBKG voltage. Through the switch SW of a given segment 810 or 840, the electrical contacts 540 of the unit resistors are connected to either VREF or VGND depending on the state of the switch. The resistors between the binary segments 810 and between the binary segments 810 and thermometric segments 840 have their electrical contacts 540 connected to PBKG as shown. In the DAC 808 of FIG. 8 the unit resistors are placed in wells separate from the resistors connecting adjacent binary segments 810 and the resistor between the binary and thermometric segment as well as wells separate from the wells of other structures in the IC.

Figure 9:
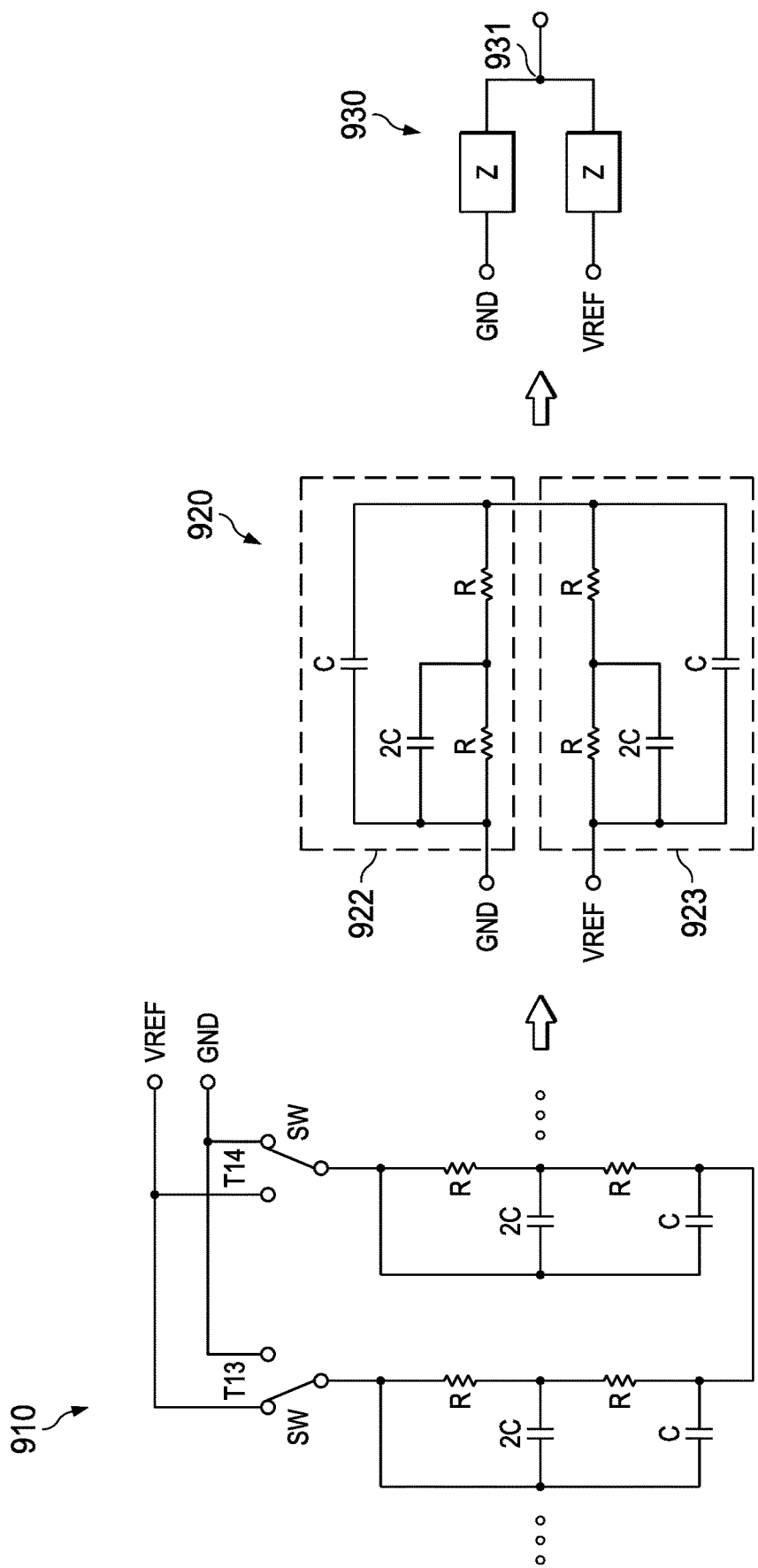
FIG. 9 includes an electrical circuit model of two adjacent segments of a resistor-based DAC as in FIG. 8.

As a result of connecting the electrical contacts 540 to switches SW, the electrical circuit model changes from the models 715/720 shown in FIG. 7 to the models 910/920/930 shown in FIG. 9. Capacitors 770 in FIG. 7 are shorted in FIG. 8 due to the connection of electrical contact 540 to the switch SW, and thus not shown in FIG. 9. The combined parallel 2C capacitor in FIG. 9 are connected across the upper resistor in each segment, as better illustrated in circuit model 920. The lower capacitor C at the bottom of each segment is connected across the series-connected unit resistors, as better illustrated in circuit model 920. Each segment includes two series-connected unit resistors R, a capacitor C across both unit resistors and a 2C capacitor across one of the unit resistors. The impedance of each segment is the same and is represented in circuit model 930 as impedance Z. Circuit model 930 illustrates that the thermometric segment is a voltage divider and the voltage on the node 931 between impedances Z is VREF/2.

The resistors used in the DAC include n-wells 520 that are separate from the n-wells for the resistors connecting adjacent binary segments 810 and the resistor between the binary and thermometric segment and are also separate from the wells of other structures in the IC. By using separate n-wells and connecting those wells to the switch nodes, when a particular thermometric leg is turned on, each such thermometric leg incldues a matched impedance network as explained above with regard to FIG. 9. Any change in the state of the switch will not be dependent on R and C thereby resulting in faster settling times than for the example of FIG. 2....

Referring again to FIG. 2, each switch SW connects its segment to either VREF or VGND. Each switch SW may be implemented as a pair of transistors, for example, a p-type metal oxide semiconductor field effect transistor (PMOS) and an n-type metal oxide semiconductor field effect transistor (NMOS). The PMOS transistor is connected to VREF and, when on, connects VREF to the series-connected resistors. The NMOS transistor is connected to VGND and, when on, connects VGND to the series-connected resistors. In general, the on-resistances of PMOS transistors on an IC track consistently among themselves in the face of changes such as temperature or VREF voltage. Similarly, the on-resistances of NMOS transistors on an IC also track consistently among themselves.

The PMOS and NMOS transistors present a constraint that the on-resistance between PMOS and NMOS transistors will not track across process and temperature. It can be shown that the INL because of the switch resistance mismatch is equal to:

$$INL_{switch} = \frac{RON_{NMOS} - RON\_PMOS}{4*R'} \quad (1)$$

where R' in Eq. (1) is the resistance of single thermometric segment (e.g., 2R in the examples described herein) and $INL_{SWITCH}$ is the INL contribution due to switch resistance mismatch. One way to reduce INL because of switch resistance mismatch is to choose larger resistances for the unit resistors R. However, a larger resistance will result in a longer settling time, and generally the value of R is determined by the settling requirement for the DAC. Alternatively, $INL_{SWITCH}$ can be decreased by increasing the size of the PMOS and NMOS transistors, which results in smaller values of their on-resistance. Increasing the size of the transistors, however, unfortunately results in a larger area DAC.

Figure 10:
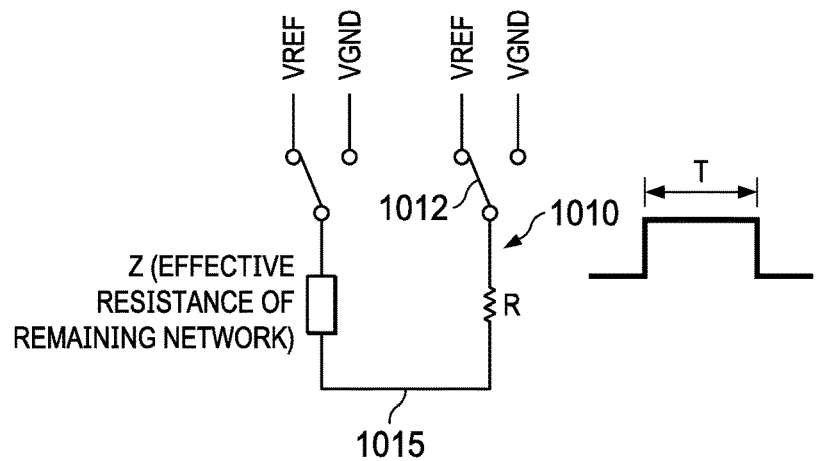
FIG. 10 shows a timing diagram illustrating the settling time period of a segment of the resistor-based DAC of FIG. 2.
Figure 11:
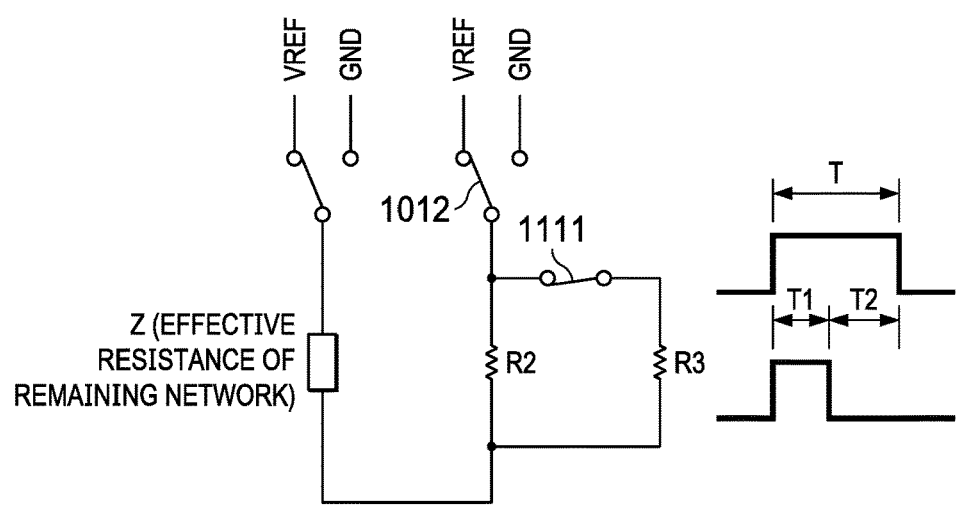
FIG. 11 shows an alternative example of the individual segments of a resistor-based DAC and a timing diagram illustrating the settling time period.

FIGS. 10 and 11 describe a different mechanism to reduce INL. FIG. 10 illustrates a single segment 1010 (e.g., a binary segment or a thermometric segment). Resistor R represents the resistance of the segment to achieve a target settling time, t. That is, when the switch 1012 is configured to connect the resistor R to VREF, the voltage on node 1015 due to the sudden from VGND to VREF should settle within time t.

FIG. 11 shows an implementation in which resistor R is replaced with two resistors R2 and R3 coupled in parallel via switch 1111. R2 may be implemented as polysilicon-based resistor such as that shown in FIGS. 5, and R3 may be implemented as a polysilicon-based resistor with relatively high sheet resistivity and a relatively small width (compared to resistor R2). The settling time period t (also referred to as the operation period of time) is divided into two portions—t1 and t2. During t1, switch 1111 is closed and the effective resistance of the parallel combination of R2 and R3 is smaller than either R2 or R3 individually, and smaller than R. During t2, switch 1111 is open and only resistor R2, which is larger than R, receives current. With this arrangement, the settling time generally remains the same (t) because R2||R3 (which is smaller than R) is used during t1, and R2 is used during t2. The final settling happens with R2 (larger than R) and thus per Eq. (1) above with R' being larger, the INL is smaller.

The equations below illustrate an example of how to choose the values of the resistors R2 and R3. The switch 1111 turns on for time t1 and the parallel combination of R2 and R3 (effective resistance R1) is coupled to VREF through switch 1012. The effective bulk capacitance of R1 (e.g., the parasitic capacitance of R2 as illustrated in FIG. 5) is C. The charging equation in time interval t1 is:

$$V1 = Vx * \left(1 - e^{-\frac{t1}{R1*C}}\right) \quad (2)$$

where V1 is the intermediate voltage value (i.e., the voltage across R1 at the end of t1), and Vx is the final voltage at the end of the time period t2.

After time t1, switch 1111 opens (turns off), and the resistor value becomes R2. Final settling happens from the intermediate voltage V1 to the final voltage value (VF) per the following equations:

$$VF = Vx - (Vx - V1)e^{-\frac{t2}{R2*C}} \quad (3)$$

$$VF = Vx - \left(Vx - \left(Vx * \left(1 - e^{-\frac{t1}{R1*C}}\right)\right)\right)e^{-\frac{t2}{R2*C}} \quad (4)$$

$$VF = Vx - Vx * e^{-\frac{t1}{R1*C}} * e^{-\frac{t2}{R2*C}} \quad (5)$$

$$VF = Vx\left(1 - e^{-\frac{t1}{R1*C} - \frac{t2}{R2*C}}\right) = Vx\left(1 - e^{-\frac{t1+t2}{R*C}}\right) \quad (6)$$

Per Eq. (6) the value of R for target settling in time t1+t2 can be achieved by using resistor R1 in time t1 and R2 in time t2. For example, assuming a resistance of 60KΩ is required for a target settling time. Resistor R2 can be a 100KΩ resistor and R3 can be another 100KΩ resistor. When switch 1111 is turned on, the effective resistance of the parallel combination of R2 and R3 is 50KΩ. If switch 1111 is turned on for time 2t/3 amd turned off for t/3, the settling time will be the same as if a single 60KΩ had been used for the entire time period, t. Because the resistance at the end of time period t is 100KΩ, the INL is reduced without increasing the size of the transistors used for switch 1012.

Figure 12:
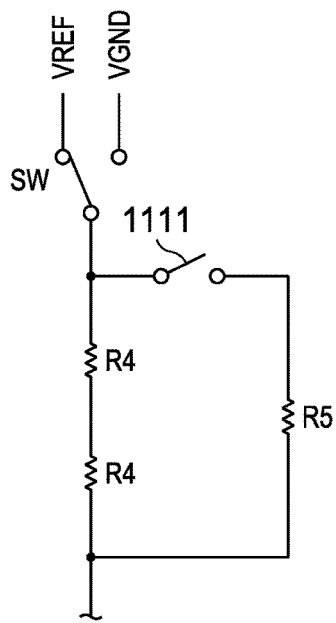
FIG. 12 shows an example implementation for reducing the integral nonlinearity of a pair of series-connected resistors due to switch resistance mismatch within the DAC.

In one example, each unit resistor R in FIG. 2 can be implemented as shown in the example of FIG. 11. In another example, as illustrated in FIG. 12, switch 111 and a resistor R5 can be connected across each pair of series-connected unit resistors R4, rather than across each individual unit resistor. The resistance of each resistor R4 is larger than R in FIG. 2, and the effective parallel resistance of 2*R4 and R5 is smaller than R, as explained above.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

What is claimed is:

1. An analog-to-digital converter (ADC), comprising:
a digital-to-analog converter (DAC) including a resistor network, the resistor network including a first segment and a second segment, the first segment including a first switch coupled between a first supply voltage node and a first set of resistors, and the second segment including a second switch coupled between the first supply voltage node and a second set of resistors;
the first segment including a third switch coupled in series with a second resistor, the series-combination of the third switch and second resistor being coupled in parallel with at least one resistor of the first set of resistors; and
the second segment including a fourth switch coupled in series with a third resistor, the series-combination of the fourth switch and third resistor being coupled in parallel with at least one resistor of the second set of resistors.

2. The ADC of claim 1, in which the series-combination of the third switch and second resistor is coupled in parallel with a series-combination of at least two resistors of the first set of resistors, and the series-combination of the fourth switch and third resistor is coupled in parallel with a series-combination of at least two resistors of the second set of resistors.

3. The ADC of claim 1, in which the first segment includes a binary segment and the second segment includes a thermometric segment, and the resistor network includes a third set of resistors coupled between the binary and thermometric segments, the third set of resistors includes fourth and fifth resistors coupled in series, sixth and seventh resistors coupled in series, and the series combination of the fourth and fifth resistors is coupled in parallel with the series combination of the sixth and seventh resistors.

4. The ADC of claim 1, in which the second set of resistors includes:
fourth, fifth, sixth, and seventh resistors coupled in series between the second switch and an output node of the DAC; and
eighth, ninth, tenth, and eleventh resistors coupled in series, and the series combination of the fourth through seventh resistors is coupled in parallel with the series combination of the eighth through eleventh resistors.

5. The ADC of claim 4, in which the first set of resistors include fewer resistors than the second set of resistors.

6. The ADC of claim 1, in which each resistor of the first set of resistors includes:
a polysilicon resistor formed on an n-well;
a p-doped substrate;
an n-doped region having a higher doping concentration than the n-well;
an electrical connection to the n-doped region, the electrical connection coupled to the first switch.

7. The ADC of claim 1, including a comparator coupled to an output node of the DAC, and including a register coupled to an output of the comparator and to an input of the DAC.

8. An analog-to-digital converter (ADC), comprising:
a digital-to-analog converter (DAC) including a resistor network, the resistor network including binary segments and thermometric segments;
a first thermometric segment includes a first switch and pair of unit resistors coupled in series between the first switch and an output node of the DAC; and
a second thermometric segment includes a second switch and eight unit resistors coupled between the second switch and the output node.

9. The ADC of claim 8, in which four of the eight unit resistors are coupled in series, and another four of the eight unit resistors are also coupled in series, the two series of unit resistors are coupled to each other in parallel.

10. The ADC of claim 8, in which the first thermometric segment includes a third switch coupled in series with a second resistor, the series-combination of the third switch and second resistor coupled in parallel with at least one of the corresponding pair of unit resistors of the first thermometric segment.

11. The ADC of claim 8, in which the second segment includes a fourth switch coupled in series with a third resistor, the series-combination of the fourth switch and third resistor coupled in parallel with at least one of the unit resistors of the second thermometric segment.

12. The ADC of claim 8, in which a first binary segment of the binary segments includes unit resistors and a third switch coupled in series with a second resistor, the series-combination of the third switch and second resistor coupled in parallel with at least one unit resistor of the unit resistors of the first binary segment.

13. The ADC of claim 8, in which each unit resistor of the first and second thermometric segments includes:
a polysilicon resistor formed on an n-well;
a p-doped substrate;
an n-doped region having a higher doping concentration than the n-well;
an electrical connection to the n-doped region, the electrical connection coupled to the respective first or second switch.

14. An analog-to-digital converter (ADC), comprising:
a digital-to-analog converter (DAC) including a resistor network, the resistor network including segments, the segments including a first segment which includes a first switch and a first set of resistors, the first switch coupled between a supply voltage node and the first set of resistors;
the first segment also includes a second switch coupled in series with a second resistor, the series-combination of the second switch and second resistor are coupled in parallel with at least one resistor of the first set of resistors, and when the first switch is controlled to apply a supply voltage to the first set of resistors for an operation period of time, the second switch is configured to be turned on for less than the operation period of time and then turned off for a remainder of the operation period of time.

15. The ADC of claim 14, in which the series-combination of the second switch and second resistor is coupled in parallel with a series-combination of at least two resistors of the first set of resistors.

16. The ADC of claim 14, in which the plurality of segments includes a second segment, the second segment including third switch and a second set of resistors, the third switch coupled between the supply voltage node and the second set of resistors, and the resistor network includes a third set of resistors coupled between the binary and thermometric segments, the third set of resistors includes fourth and fifth resistors coupled in series, sixth and seventh resistors coupled in series, and the series combination of the fourth and fifth resistors is coupled in parallel with the series combination of the sixth and seventh resistors.

17. The ADC of claim 16, in which the first set of resistors includes more resistors than the second set of resistors, and the first set of resistors has a same effective resistance as the second set of resistors.

18. The ADC of claim 1, in which the first set of resistors includes:
- fourth, fifth, sixth, and seventh resistors coupled in series between the first switch and an output node of the DAC; and
- eighth, ninth, tenth, and eleventh resistors coupled in series, and the series combination of the fourth through seventh resistors is coupled in parallel with the series combination of the eighth through eleventh resistors.

19. The ADC of claim 14, in which each resistor of the first set of resistors includes:
- a polysilicon resistor formed on an n-well;
- a p-doped substrate;
- an n-doped region having a higher doping concentration than the n-well;
- an electrical connection to the n-doped region, the electrical connection coupled to the first switch.

* * * * *